(12) United States Patent
Kwak et al.

(10) Patent No.: US 9,548,019 B2
(45) Date of Patent: Jan. 17, 2017

(54) ORGANIC LIGHT EMITTING DISPLAY DEVICE

(71) Applicant: Samsung Display Co., Ltd., Yongin (KR)

(72) Inventors: Won-Kyu Kwak, Yongin (KR); Hwan-Soo Jang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/722,835

(22) Filed: May 27, 2015

(65) Prior Publication Data

US 2016/0056213 A1    Feb. 25, 2016

(30) Foreign Application Priority Data

Aug. 25, 2014  (KR) .................. 10-2014-0110899

(51) Int. Cl.
| | | |
|---|---|---|
| *H05B 37/00* | (2006.01) | |
| *H05B 39/00* | (2006.01) | |
| *G09G 3/32* | (2016.01) | |
| *H01L 27/32* | (2006.01) | |

(52) U.S. Cl.
CPC ......... *G09G 3/3208* (2013.01); *H01L 27/3276* (2013.01); *G09G 2320/02* (2013.01); *G09G 2330/08* (2013.01); *H01L 2251/568* (2013.01)

(58) Field of Classification Search
None
See application file for complete search history.

(56) References Cited

U.S. PATENT DOCUMENTS

| | | | | |
|---|---|---|---|---|
| 5,392,143 | A | * 2/1995 | Akiyama | ............ G02F 1/13624 |
| | | | | 345/93 |
| 2004/0066146 | A1 | * 4/2004 | Park | ...................... G09G 3/3233 |
| | | | | 315/169.3 |
| 2005/0078240 | A1 | 4/2005 | Murade | |
| 2007/0035687 | A1 | 2/2007 | Oke et al. | |
| 2007/0040794 | A1 | * 2/2007 | Kwak | ............... G02F 1/136259 |
| | | | | 345/100 |
| 2009/0128020 | A1 | 5/2009 | Takei et al. | |
| 2009/0284679 | A1 | 11/2009 | Kim et al. | |
| 2014/0240304 | A1 | * 8/2014 | In et al. | ........................ 345/212 |
| 2014/0313106 | A1 | * 10/2014 | In et al. | .......................... 345/76 |
| 2015/0103103 | A1 | * 4/2015 | Kim et al. | ..................... 345/690 |

FOREIGN PATENT DOCUMENTS

| | | |
|---|---|---|
| KR | 10-2005-0022367 | 3/2005 |
| KR | 10-2007-0019553 | 2/2007 |
| KR | 10-2008-0060499 | 7/2008 |
| KR | 10-2009-0052277 | 5/2009 |

* cited by examiner

*Primary Examiner* — Anh Tran
(74) *Attorney, Agent, or Firm* — H.C. Park & Associates, PLC

(57) ABSTRACT

An organic light emitting display device includes: a display area including a plurality of pixels including organic light emitting diodes, pixel circuits connected to the organic light emitting diodes, and one or more repair circuit units disposed between the pixel circuits of the pixels disposed on adjacent lines, in which the one or more repair circuit units include a plurality of repair circuits arranged to form at least one line within the display area.

17 Claims, 6 Drawing Sheets

ORGANIC LIGHT EMITTING DISPLAY DEVICE

CROSS-REFERENCE TO RELATED APPLICATION

This application claims priority from and the benefit under 35 USC §119(a) of Korean Patent Application No. 10-2014-0110899, filed on Aug. 25, 2014, the entire disclosure of is incorporated herein by reference for all purposes.

BACKGROUND

Field

Present disclosure relates to an organic light emitting display device.

Discussion of the Background

An organic light emitting display device displays an image by using an organic light emitting diode (OLED), which generates light by re-combination of electrons and holes. OLEDs have an advantage in that the organic light emitting display device has a fast response speed and is driven with low power consumption.

The organic light emitting display device is classified into a Passive Matrix Organic Light Emitting Display Device (PMOLED) and an Active Matrix Organic Light Emitting Display Device (AMOLED) according to a method of driving an organic light emitting diode.

Among them, the AMOLED may implement a quality image and has lower power consumption compared to the PMOLED, so that a use range thereof is gradually expanded.

SUMMARY

Exemplary embodiments of the present invention provide an organic light emitting display device, which includes a repair circuit unit for repairing a pixel defect to improve yield, and improve an image quality.

Additional features of the invention will be set forth in the description which follows, and in part will be apparent from the description, or may be learned by practice of the invention.

Exemplary embodiments of the present invention provide an organic light emitting display device, including: a display area including a plurality of pixels including organic light emitting diodes, pixel circuits connected to the organic light emitting diodes, and one or more repair circuit units disposed between the pixel circuits of the pixels disposed on adjacent lines, in which the one or more repair circuit units include a plurality of repair circuits arranged to form at least one line within the display area.

Exemplary embodiments of the present invention provide an organic light emitting display device including a first pixel including a first organic light emitting diode, and a first pixel circuit; a second pixel including a second organic light emitting diode, and a second pixel circuit; and a repair circuit disposed between the first pixel circuit and the second pixel circuit, and configured to drive the first organic light emitting diode when a defect is generated in the first pixel.

Exemplary embodiments of the present invention provide an organic light emitting display device including a pixel having an organic light emitting diode, and a pixel circuit configured to drive the organic light emitting diode; and a repair circuit configured to drive the organic light emitting diode when a defect is generated in the pixel circuit.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
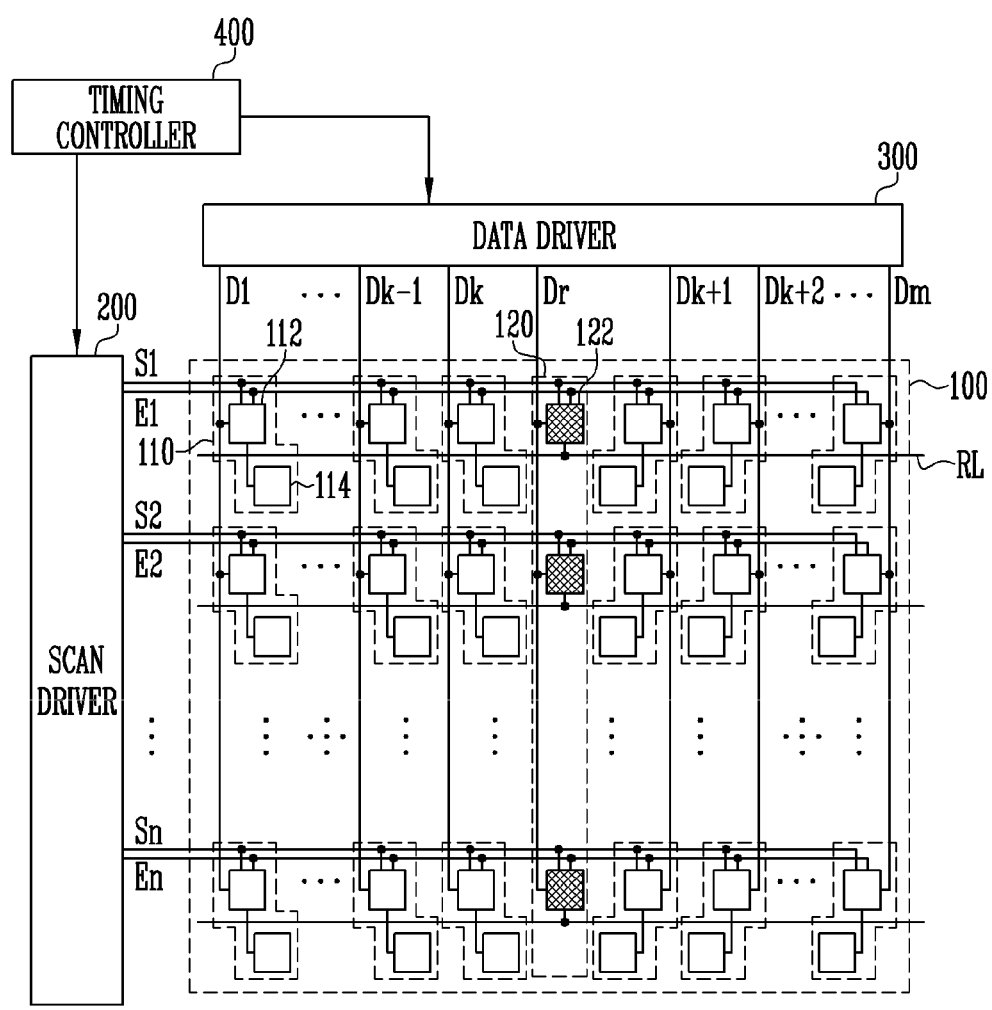
FIG. 1 is a diagram illustrating an organic light emitting display device according to an exemplary embodiment of the present invention.

The invention is described more fully hereinafter with reference to the accompanying drawings, in which embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. It will be understood that for the purposes of this disclosure, "at least one of X, Y, and Z" can be construed as X only, Y only, Z only, or any combination of two or more items X, Y, and Z (e.g., XYZ, XZ, XYY, YZ, ZZ). Throughout the drawings and the detailed description, unless otherwise described, the same drawing reference numerals are understood to refer to the same elements, features, and structures. The relative size and depiction of these elements may be exaggerated for clarity.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Although some features may be described with respect to individual exemplary embodiments, aspects need not be limited thereto such that features from one or more exemplary embodiments may be combinable with other features from one or more exemplary embodiments.

FIG. 1 is a diagram illustrating an organic light emitting display device according to an exemplary embodiment of the present invention.

Referring to FIG. 1, an organic light emitting display device according to an exemplary embodiment of the present invention includes a display area 100 including a plurality of pixels 110, a scan driver 200, a data driver 300, and a timing controller 400. The plurality of pixels 110 may be positioned at or near crossing parts of scan lines S, emission control lines E1, and data lines D. The scan driver 200 may drive the scan lines S and the emission control lines E. The data driver 300 may drive the data lines D. The timing controller 400 may control the data driver 300. However, aspects of the invention are not limited thereto, such that the emission control lines E illustrated in FIG. 1 may be omitted according to internal structures of the pixels 110. Further, although not illustrated in FIG. 1, a pixel power supply line for providing a pixel power source and the like may be further included in the display area 100.

Further, the organic light emitting display device according to exemplary embodiments may be characterized by further including one or more repair circuit units 120 included within the display area 100, which will be described in more detail below.

The display area 100 includes organic light emitting diodes 114 and the plurality of pixels 110 including pixel circuits 112 connected to the organic light emitting diodes 114, respectively. Further, the display area includes one or more repair circuit units 120 inserted between the pixel circuits 112 of select pixels among the pixels 110.

The organic light emitting diodes 114 may be configured as an emission unit of one or more pixels 110.

The pixel circuit 112 may drive the organic light emitting diode 114 in response to a scan signal, an emission control signal, and a data signal supplied from a corresponding scan line S, a corresponding emission control line E, and a corresponding data line D, respectively. The pixel circuit 112 may be configured as a driving unit of one or more pixels 110.

Further, referring to FIG. 1, the pixel circuit 112 and the organic light emitting diode 114 are illustrated as not overlapping each other for more clearly discriminating constituent elements of each pixel 110, but aspects of the invention are not limited thereto. For example, the pixel circuit 112 and the organic light emitting diode 114 of each pixel 110 may be positioned in different layers, so that at least some areas of the pixel circuit 112 and the organic light emitting diode 114 of each pixel 110 may overlap each other.

Further, the repair circuit unit 120 is illustrated as not overlapping the pixels 110, but aspects of the invention are not limited thereto. For example, the repair circuit unit 120 may be formed or disposed on the same layer as those of the pixel circuits 112, so that the repair circuit unit 120 may be positioned on different layers from those of the organic light emitting diodes 114 of the adjacent pixels 110 to at least partially overlap the organic light emitting diodes 114.

An exemplary embodiment related to a disposition of the pixel circuits 112, the organic light emitting diodes 114, and the repair circuit unit 120 will be described below.

The repair circuit unit 120 is formed or disposed between the pixel circuits 112 of select pixels among the pixels 110 disposed within the display area 110. More particularly, the repair circuit unit 120 may include a plurality of repair circuits 122 arranged to form at least one line between the pixel circuits 112 of the pixels 110 disposed on two adjacent lines within the display area 100.

For example, the repair circuit 120 may include the plurality of repair circuits 122 arranged in parallel in a vertical direction to form one vertical line at a central part of the display area 100 similar to the exemplary embodiment illustrated in FIG. 1.

More particularly, the repair circuits 122 may be disposed between the pixel circuits 112 included in the pixels 110 on two adjacently disposed column lines at the central part of the display area 100. For example, one repair circuit 122 may be formed or disposed in each row line.

Although the repair circuit unit 120 is illustrated as being disposed to form a vertical line, but aspects of the invention are not limited thereto. For example, the repair circuits 122 may be formed for each column line so that the repair circuit unit 120 forms a horizontal line.

The repair circuits 122 may drive the organic light emitting diode 114 of the corresponding pixel instead of the pixel circuit 112 when a defect is generated in the pixel circuit 112. Similar to the pixel circuits 112, the repair circuits 122 may be connected to the scan lines S and/or the emission control lines E disposed on the corresponding row line and the data lines Dr disposed on the corresponding column line.

Further, the repair circuits 122 may be configured to be similar or the same as the pixel circuits 112. More specifically, even after the defect of the pixel is repaired, an emission property of the repaired pixel may be maintained at the same or similar level to those of the emission properties of the remaining pixels to maintain a uniform image quality.

However, aspects of the present invention are not limited thereto, such that the repair circuits 122 may be formed in less number than the pixel circuits 112, or a capacity of a storage capacitor and/or a boost capacitor includable inside the repair circuits 122 may be differently set from those of the pixel circuits 112. However, even in this case, it may be possible to configure the repair circuits 122 so that the emission property of the organic light emitting diode 114 driven by the repair circuits 122 may be maintained at a similar level to that of the emission properties of the organic light emitting diodes 114 of the remaining pixels. Accordingly, the organic light emitting display device may be designed or configured so that the defect of the pixel may not be noticed or less noticeable.

In the organic light emitting display device according to an exemplary embodiment of the present invention, when a defect is generated in the pixel circuit 112 of at least one pixel among the pixels 110, the organic light emitting diode 114 of the corresponding pixel connected to the repair circuit unit 120 instead of the pixel circuit 112, in which the defect is generated, to be driven by the repair circuit unit 120.

More particularly, when the repair circuits 112 are arranged in a vertical direction to be disposed on the row lines, respectively, the organic light emitting diode 114 of the defective pixel may be connected to the repair circuit 122 disposed on the same row line to be driven. Accordingly, the defect of the pixel may be repaired while the organic light emitting diode 114 emits light with luminance corresponding to the data signal.

Further, the organic light emitting display device according to an exemplary embodiment may further include a plurality of repair lines RL for connecting the organic light emitting diode 114 of the defective pixel and the repair circuit unit 120.

The repair lines RL may be formed or configured to be connected to the repair circuits 122.

For example, when the repair circuits 122 are formed in the row lines, the repair lines RL connected with the repair circuits 122 may be formed in a horizontal direction for each row line. Accordingly, when a defect is generated in the pixel circuit 112 included in a pixel of a corresponding row line, the organic light emitting diode 114 of the corresponding pixel may be connected to the repair circuit 122 disposed on the same row line through the repair line RL formed along the corresponding row line.

Further, the repair lines RL may not be formed in the horizontal direction as illustrated in FIG. 1.

More specifically, the repair lines RL may be configured to connect, when a defect is generated in the pixels 110, the organic light emitting diode 114 of the corresponding pixel to a repair circuit among the repair circuits 122, for example, the repair circuit 122 disposed on the same row line or column line. Further, the repair circuits 122 may be disposed in a direction, in which the repair lines RL are formed. The location, direction and the like may be variously changed according to a disposition structure of the repair circuits 122.

For example, when the repair circuits 122 are formed or configured in the column lines of a predetermined row line, the repair lines RL may be formed or configured in the vertical direction to connect the repair circuit 122 in each column line to the organic light emitting diodes 114 included in the pixels 110 of the corresponding column line.

More specifically, the repair lines RL is formed or configured to connect the repair circuits 122 to the organic light emitting diodes 114 of the pixels 110 disposed on the corresponding row line or column line, respectively. For example, the repair lines RL may be formed or configured to extend in a direction crossing a direction in which the repair circuits 122 are arranged.

Further, the repair lines RL may be formed or configured to cross connection lines between the organic light emitting diodes 114 and the pixel circuits 112 of the pixels 110 disposed on the row line or column line, in which the corresponding repair circuit 122 is disposed, or be formed or configured to partially overlap the connection lines. In this case, in an operation of repairing the defective pixel, it may be possible to more easily connect the organic light emitting diode 114 of the pixel and the corresponding repair line RL.

The scan driver 200 may generate scan signals and emission control signals in response to a scan control signal supplied from the timing controller 400, and output the generated scan signals and emission control signals to the scan lines S and the emission control lines E, respectively. However, according to aspects of the invention, the emission control signals may not be generated according to a structure of the pixel circuits 114, and in this case, the emission control lines E may be omitted.

The data driver 300 may generate data signals in response to a data control signal supplied from the timing controller 400 and image data, and output the generated data signals to the data lines D.

Further, the data driver 300 may output the data signals corresponding to the pixels 110 of a selected horizontal line to the data lines D1 to Dm connected to the pixels 110 for horizontal period of times, respectively, and output a bias voltage or a data signal of the repaired pixel to the data line Dr connected with the repair circuit unit 120.

More particularly, when there is a repaired pixel to be connected to the repair circuit unit 120 among the pixels 110 in a corresponding horizontal line for each horizontal period of time, the data driver 300 may output the data signal corresponding to the repaired pixel to the data lines Dr connected with the repair circuit unit 120. However, when there is no pixel repaired to be connected to the repair circuit unit 120 among the pixels 110 disposed on the selected horizontal line for each horizontal period of time, the data driver 300 may output a predetermined bias voltage to the data line Dr connected with the repair circuit unit 120.

The timing controller 400 may generate a scan control signal and a data control signal in response to various control signals supplied from the outside, and supply the generated scan control signal and data control signal to the scan driver 200 and the data driver 300, respectively. Further, the timing controller 400 may align image data input from the outside and supply the aligned image data to the data driver 300 so that data signals corresponding to the image data may be generated.

Further, the timing controller 400 may store information about the repaired pixel to be connected to the repair circuit unit 120, and control the data driver 300 so that the data signal of the pixel may be output to the data line Dr connected with the repair circuit unit 120 when the horizontal line, in which the pixel is arranged, is selected.

The aforementioned organic light emitting display device according to an exemplary embodiment of the present invention may include the repair circuit unit 120 for driving the corresponding organic light emitting diode 114 instead of the pixel circuit 112, in which a defect may be generated, when the defect is generated in the pixel circuit 112 and the like. Accordingly, it may be possible to more easily repair the defect of the pixel, thereby improving yield of the organic light emitting display device.

More particularly, according to exemplary embodiments of the present invention, the repair circuit unit 120 may be inserted into the display area 100 in which the pixels 110 are disposed and decrease distances between the repair circuit unit 120 and the pixels 110.

For example, when only one repair circuit unit 120 forming one vertical line is formed or disposed in the display area, the repair circuit unit 120 may be configured to be disposed at a central part of the display area 100, so that it may be possible to dispose the repair circuit unit 120 and the pixels 110 by optimizing or configuring the distances between the repair circuit unit 120 and the pixels 110.

To this end, even when the defective pixel is connected to the repair circuit unit 120 to be driven, it may be possible to prevent or impede an image quality from being degraded by decreasing a load generated between the organic light emitting diode 114 of the defective pixel and the repair circuit unit 120, and improve image quality of the organic light emitting display device. Accordingly, exemplary embodiments of the present invention may be applied to a large display device, as well as a small display device, for improving yield and an image quality.

Figure 2:
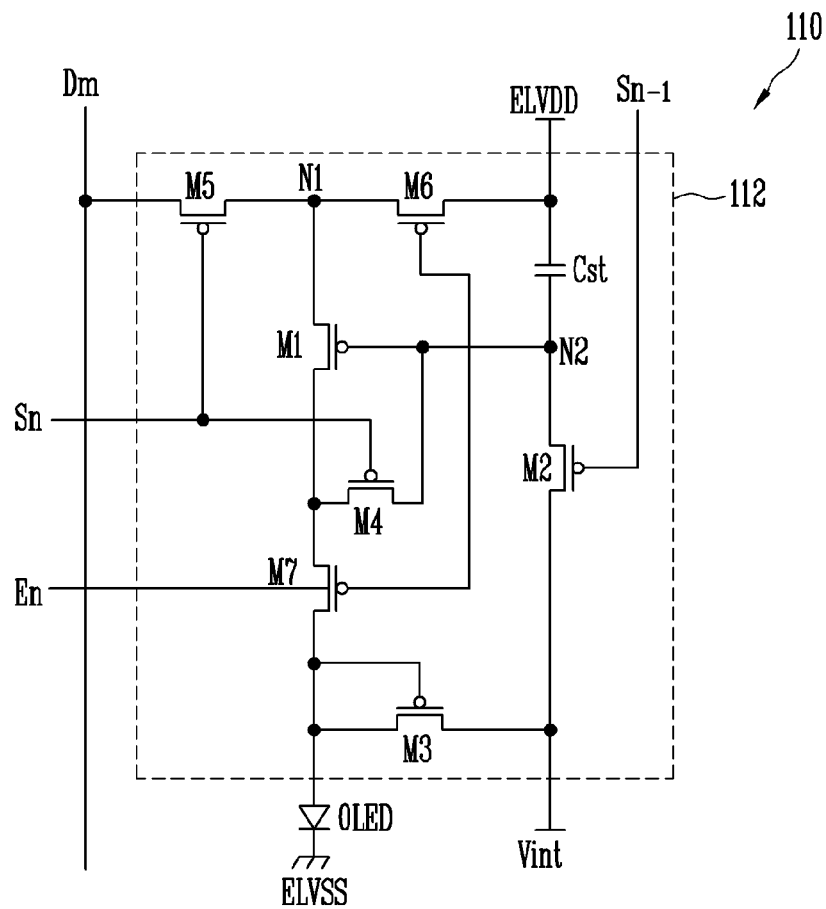
FIG. 2 is a circuit diagram illustrating a pixel according to exemplary embodiments of the present invention.
Figure 3:
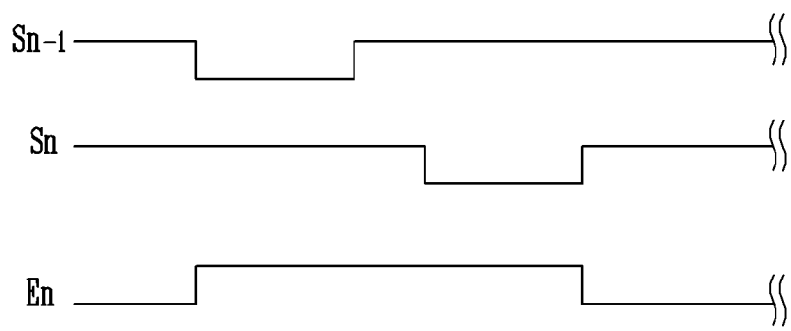
FIG. 3 is a waveform diagram of an input signal for describing a driving method of a pixel according to exemplary embodiments of the present invention.

FIG. 2 is a circuit diagram illustrating a pixel according to exemplary embodiments of the present invention. FIG. 3 is a waveform diagram of an input signal for describing a driving method of a pixel according to exemplary embodiments of the present invention. Although FIGS. 2 and 3 illustrate a pixel disposed on an $n^{th}$ row line and an $m^{th}$ column line, and an input signal of the pixel, aspects of the invention are not limited thereto.

FIGS. 2 and 3 illustrate an exemplary embodiment of a pixel structure applicable to an organic light emitting display device, such as the organic light emitting display device of FIG. 1, however, aspects of the invention are not limited thereto. More specifically, the technical spirit of the present invention may be widely applied to organic light emitting display devices adopting various pixel structures.

First, referring to FIG. 2, the pixel 110 includes an organic light emitting diode OLED, which may for example correspond to reference numeral 114 of FIG. 1, and the pixel circuit 112 for driving the OLED 114.

The organic light emitting diode OLED may be connected between the pixel circuit 112 and a second pixel power source ELVSS. The second pixel power source ELVSS may be set, for example, as a low potential pixel power source. The organic light emitting diode OLED may emit light at predetermined luminance in response to a current quantity supplied from the pixel circuit 112.

The pixel circuit 112 is connected to a scan line Sn and an emission control line En of a corresponding row line, and a data line DM of a corresponding column line to be driven. Further, the pixel 110 is connected to a scan line Sn−1 of a previous row line to be driven. The pixel circuit 112 may generate a driving current corresponding to a data signal supplied from the is data line Dm when a scan signal is supplied from the scan line Sn of the corresponding row line, and supply the generated driving current to the organic light emitting diode OLED.

The pixel circuit 112 includes first to seventh transistors M1 to M7, and a storage capacitor Cst.

A first electrode of the fifth transistor M5 is connected to the data line Dm, and a second electrode of the fifth transistor M5 is connected to a first node N1. A gate electrode of the fifth transistor M5 is connected to the scan line Sn of the corresponding row line. The fifth transistor M5 may be turned on when the scan signal is supplied from the scan line Sn of the corresponding row line to supply a data signal supplied from the data line Dm to the first node N1.

A first node of a first transistor M1 is connected to the first node N1, and a second electrode of the first transistor M1 is connected to a first electrode of a seventh transistor M7. A gate electrode of the first transistor M1 is connected to a second node N2. The first transistor M1 may supply a driving current corresponding to a voltage charged in the storage capacitor Cst to the organic light emitting diode OLED.

A first node of a second transistor M2 is connected to the second node N2, and a second electrode of the second transistor M2 is connected to an initialization power source Vint. A gate electrode of the second transistor M2 is connected to the previous scan line Sn−1 of the previous row line. The second transistor M2 may be turned on when the scan signal is supplied to the scan line Sn−1 of the previous row line to supply a voltage of the initialization power source Vint to the second node N2. The initialization power source Vint may be set, for example, as a voltage lower than a minimum voltage of the data signal.

A first electrode of a third transistor M3 is connected to the initialization power source Vint, and a second electrode and a gate electrode of the third transistor M3 are connected to an anode electrode of the organic light emitting diode OLED. More specifically, the third transistor M3 is connected in a form of a diode. Here, the anode electrode of the organic light emitting diode OLED is set to have a voltage higher than a voltage of the initialization power source Vint, and thus, the third transistor M3 may be maintained in an off state.

When the voltage of the anode electrode of the organic light emitting diode OLED is set to be higher than the voltage of the initialization power source Vint, a leakage path connecting from the anode electrode of the organic light emitting diode OLED to the initialization power source Vint through the third transistor M3 may be formed. More specifically, a leakage current may flow from the organic light emitting diode OLED to the initialization power source Vint through the third transistor M3, and a desired black image may be expressed. A predetermined leakage current may flow by the leakage path by the third transistor M3 when a black gray is expressed, and thus it may be possible to minimize or reduce emission of the organic light emitting diode OLED.

A first electrode of a fourth transistor M4 is connected to the second electrode of the first transistor M1, and a second electrode of the fourth transistor M4 is connected to the second node N2. A gate electrode of the fourth transistor M4 is connected to the scan line Sn of the corresponding row line. The fourth transistor M4 may be turned on when the scan signal is supplied to the scan line Sn of the corresponding row line to connect the first transistor M1 in the form of a diode.

A first electrode of a sixth transistor M6 is connected to a first pixel power source ELVDD, and a second electrode of the sixth transistor M6 is connected to the first node N1. The first pixel power source ELVDD may be set, for example, as a high potential power source. A gate electrode of the sixth transistor M6 is connected to the emission control line En of the corresponding row line. The sixth transistor M6 may be turned off when the emission control signal is supplied to the emission control line En of the corresponding row line, and may be turned on when the emission control signal is not supplied.

A first electrode of the seventh transistor M7 is connected to the second electrode of the first transistor M1, and a second electrode of the seventh transistor M7 is connected to the anode electrode of the organic light emitting diode OLED. A gate electrode of the seventh transistor M7 is connected to the emission control line En of the corresponding row line. The seventh transistor M7 may be turned off when the emission control signal is supplied to the emission control line En of the corresponding row line, and may be turned on when the emission control signal is not supplied.

The storage capacitor Cst is connected between the first pixel power source ELVDD and the second node N2 to charge a voltage corresponding to a voltage supplied to the second node N2.

An operation of the pixel according to an exemplary embodiment will be described with reference to FIG. 3. First, when an emission control signal (for example, an emission control signal of a high level) is supplied to the emission control line En of a corresponding row line, the sixth transistor M6 and the seventh transistor M7 may be turned off.

When the sixth transistor M6 is turned off, the first pixel power source ELVDD and the first node N1 may be electrically disconnected. When the seventh transistor M7 is turned off, the first transistor M1 and the organic light emitting diode OLED may be electrically disconnected. More specifically, the pixel 110 may be set in a non-emission state for a period of time for which the emission control signal is supplied.

When a scan signal (for example, a scan signal of a low level) is supplied to the scan line Sn−1 of the previous row line, the second transistor M2 may be turned on. When the second transistor M2 is turned on, the voltage of the initialization power source Vint may be supplied to the second node N2.

When the scan signal is supplied to the scan line Sn of the corresponding row line after the voltage of the initialization power source Vint is supplied to the second node N2, the fourth transistor M4 and the fifth transistor M5 may be turned on.

When the fourth transistor M4 is turned on, the first transistor M1 may be connected in the form of a diode. When the fifth transistor M5 is turned on, the data signal from the data line Dm of the corresponding row line may be supplied to the first node N1. In this case, since the voltage of the second node N2 is initialized to the voltage of the initialization power source Vint, the first transistor M1 may be turned on. A voltage obtained by subtracting a threshold voltage of the first transistor M1 from the voltage of the data signal applied to the first node N1 may be applied to the second node N2, and the storage capacitor Cst may store a voltage applied to the second node N2.

When the supply of the emission control signal to the emission control line En of the corresponding row line is stopped after a predetermined voltage is charged in the storage capacitor Cst (for example, the voltage level of the emission control signal is transited to a low level), the sixth transistor M6 and the seventh transistor M7 may be turned on. When the sixth transistor M6 and the seventh transistor M7 are turned on, a current path connected from the first pixel power source ELVDD to the second pixel power source ELVSS through the organic light emitting diode OLED may be formed. In this case, the first transistor M1 may control a quantity of the driving current flowing the first pixel power source ELVDD to the organic light emitting is diode OLED in response to the voltage charged in the storage capacitor Cst.

Further, a predetermined leakage current may flow from the organic light emitting diode OLED to the initialization power source Vint by the third transistor M3 connected in a form of an inverse diode. When the organic light emitting diode OLED emits light, large quantity of current may be supplied to the organic light emitting diode OLED, and thus, the leakage current may have limited or no influence on luminance. When the black gray is implemented, a micro current may be supplied to the organic light emitting diode OLED from the pixel circuit 112. In this case, the leakage current of the third transistor M3 may considerably influence emission of the organic light emitting diode OLED. More specifically, when the black gray is implemented, it may be possible to prevent or impede the organic light emitting diode OLED from emitting light by the leakage current of the third transistor M3.

The pixel 110 may compensate for the threshold voltage of the first transistor M1 operated as a driving transistor, and prevent or impede the organic light emitting diode OLED from emitting light by using the third transistor M3 when black luminance is implemented, thereby positively improving a contrast ratio.

As described above, the pixel circuit 112 of the organic light emitting display device may include a relatively large number of pixel elements for improving an image quality. However, in this case, a probability that a defect is generated in the pixel circuit 112 may be increased, so that yield may be decreased.

However, when the repair circuit unit 120 illustrated in FIG. 1 is applied, it may be possible to more easily repair the defect of the pixel to improve yield. Further, the repair circuit unit 120 may be appropriately disposed within the display area 110, so that it may be possible to secure an excellent image quality after the repair.

Figure 4A:
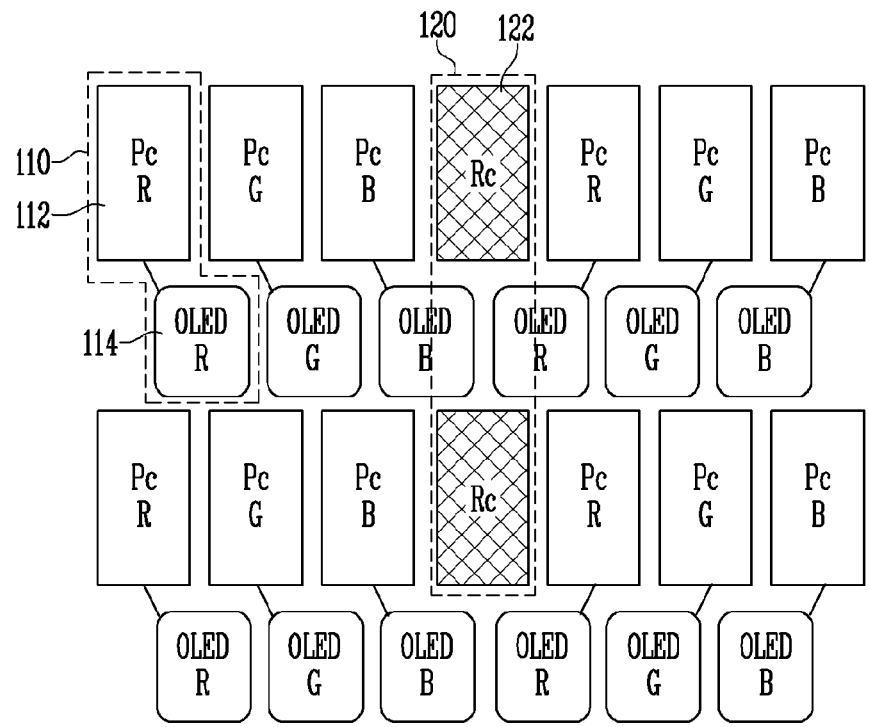
FIG. 4A is a top plan view illustrating a disposition structure within a display area according to an exemplary embodiment of the present invention.
Figure 4B:
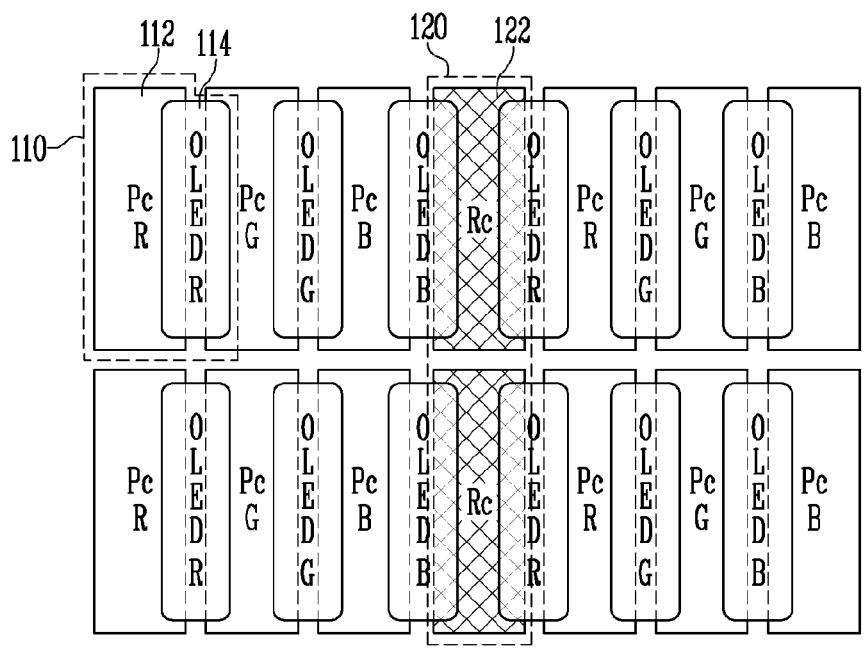
FIG. 4B is a top plan view illustrating a disposition structure within a display area according to an exemplary embodiment of the present invention.

FIG. 4A is a top plan view illustrating a disposition structure within a display area according to an exemplary embodiment of the present invention. FIG. 4B is a top plan view illustrating a disposition structure within a display area according to an exemplary embodiment of the present invention.

First, referring to FIG. 4A, the pixel circuits (Pc) 112 and the organic light emitting diodes OLED 114 configuring the pixels 110 are alternatively disposed so as not to overlap each other, and the repair circuits 122 are disposed between the pixel circuits 112 included in the pixels 110 of the adjacent two lines without overlapping the pixel circuits 112.

More specifically, the pixel circuits 112, the organic light emitting diodes 114, and the repair circuits 122 are distributed within the display area so as not to overlap each other. The exemplary embodiment illustrated in FIG. 4A may be applied to an organic light emitting display device having a bottom emission structure and the like.

Further, the pixel circuits 112 may be shifted and disposed at a predetermined interval based on the repair circuit unit 120 including the repair circuits 122 according to the insertion of the repair circuits 122. More specifically, the pixel circuits 112 may be shifted with respect to the corresponding organic light emitting diodes 114.

For example, when the repair circuit 122 is inserted into each row line, the pixel circuits 112 may be disposed at positions shifted by every 0.5 pitch in left and right directions based on the repair circuit unit 120. In this case, the pixel circuit 112 and the organic light emitting diode 114 of each pixel 110 may be disposed at a distorted position so that the pixel circuit 112 and the organic light emitting diode 114 may partially overlap on an extended line of the vertical line. Further, although not illustrated, in an exemplary embodiment in which the repair circuit unit 120 is formed in a horizontal direction, the pixel circuit 112 and the organic light emitting diode 114 of each pixel 110 may be disposed at a distorted position so that the pixel circuit 112 and the organic light emitting diode 114 may partially overlap on an extended line of the horizontal line.

However, aspects of the invention are not limited thereto, such that when two or more repair circuits 122 are inserted in every row line or column line, the pixel circuit 112 and the organic light emitting diode 114 configuring each pixel 110 may be disposed to be distorted so that the pixel circuit 112 and the organic light emitting diode 114 may not overlap on the extended line of the vertical line or the horizontal line.

The pixel circuits 112 included in the remaining pixels 110, except for the pixels 110 disposed to be adjacent to the repair circuit unit 120, may be disposed on the extended line of the vertical line or the horizontal line of the organic light emitting diodes 114 of the corresponding pixel and the adjacent pixels. Further, when the plurality of repair circuits 122 is inserted into each row line or column line, the pixel circuits 112 included in the remaining pixels 110 may not be disposed on the extended line of the vertical line or the horizontal line of the organic light emitting diode 114 of the corresponding pixel.

However, unlike the pixel circuits 112 of which the positions are shifted according to the insertion of the repair circuit unit 120, the organic light emitting diodes 114 may maintain the same positions as those before the insertion of the repair circuit unit 120.

In this case, the repair circuit unit 120 may be disposed on the extended line of the vertical line of the organic light emitting diodes 114, which may be included in the pixels 110 disposed to be adjacent to the repair circuit unit 120. Further, although not illustrated in FIG. 4A, when the repair circuit unit 120 is formed in the horizontal direction, the repair circuit unit 120 may be disposed on the extended line of the horizontal line of the organic light emitting diodes 114 of the adjacent pixels 110.

As described above, when the organic light emitting diodes 114 are disposed regardless of the insertion of the repair circuit unit 120, the emission units recognized by a user may be generally and uniformly distributed and disposed in the display area 110 regardless of the position of the repair circuit unit 120. Accordingly, when the repair circuit unit 120 is inserted, a vertical line may be prevented or less likely from being viewed according to the insertion of the repair circuit unit 120, thereby uniformly maintaining an image quality.

However, aspects of the invention are not limited to the structure illustrated in FIG. 4A. As illustrated in FIG. 4B, the organic light emitting diodes 114 may also be disposed to overlap the pixel circuits 112 of the corresponding pixel and/or the adjacent pixel and the repair circuits 122. The exemplary embodiment illustrated in FIG. 4B may be applied to an organic light emitting display device having a top emission structure and the like.

More particularly, the organic light emitting diode 114 of the pixel 110 may be formed or disposed on the pixel circuit 112 to partially overlap the pixel circuit 112 of the corresponding pixel, and may partially overlap the pixel circuit 112 of the adjacent pixel or the repair circuit 122 inside the repair circuit unit 120 by a level by which the pixel circuits 112 are shifted based on the repair circuit unit 120.

However, aspects of the invention are not limited thereto, such that when the plurality of repair circuits 122 are inserted into each row line or column line, the organic light emitting diode 114 of the pixels 110 may be distorted and disposed to maintain a connection with the corresponding pixel circuit 112, but not to overlap the pixel circuit 112.

The organic light emitting diodes 114 may be disposed regardless of the insertion of the repair circuit unit 120, thereby uniformly maintaining an image quality.

Figure 5:
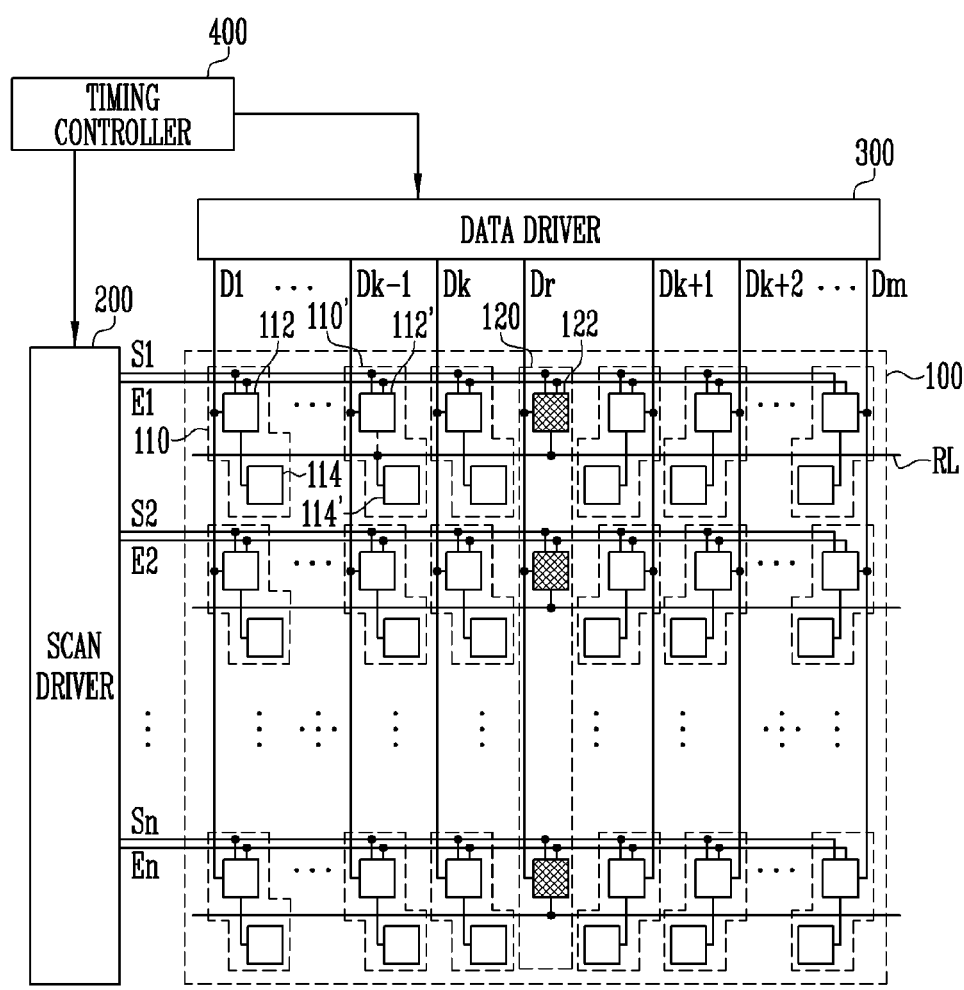
FIG. 5 is a diagram illustrating the organic light emitting display device including a repaired pixel according to an exemplary embodiment of the present invention.

FIG. 5 is a diagram illustrating the organic light emitting display device including a repaired pixel according to an exemplary embodiment of the present invention.

Referring to FIG. 5, when a defect is generated in a pixel circuit 112', the pixel 110' including the pixel circuit 112' has disconnection between a corresponding organic light emitting diode 114' and the pixel circuit 112', and the organic light emitting diode 114' of the pixel 110' may be connected to the repair circuit unit 120 and repaired to be driven.

More particularly, the organic light emitting diode 114' of the pixel 110' may be connected to a repair circuit 122' disposed on the same row line (e.g., the same row line when the repair circuit unit 120 is formed or configured in the horizontal direction) among the repair circuits 122 included in the repair circuit unit 120 to be driven.

In this case, the organic light emitting diode 114' of the pixel 110' and the repair circuit 122' corresponding thereto may be more easily connected through the repair line RL of the corresponding row line (or column line).

When the defective pixel is repaired as described above, a data signal corresponding to the pixel 110' may be supplied to the data line Dr connected to the repair circuit unit 120 for a horizontal period of time for which the row line, in which the repaired pixel 110' is disposed, may be selected. The repair circuit 122' connected to the organic light emitting diode 114' of the pixel 110' may generate a driving current corresponding to the data signal and drive the organic light emitting diode 114'. Further, data signals corresponding to the pixels 110 of each column line may be supplied to the remaining data lines D1 to Dm, except for the data line Dr connected to the repair circuit unit 120.

Accordingly, it may be possible to repair the defective pixel while the organic light emitting diode 114' of the pixel 110' is normally driven.

Further, when there is no repaired pixel for the corresponding horizontal period of time, a predetermined bias voltage may be applied to the data line Dr connected to the repair circuit unit 120.

Figure 6:
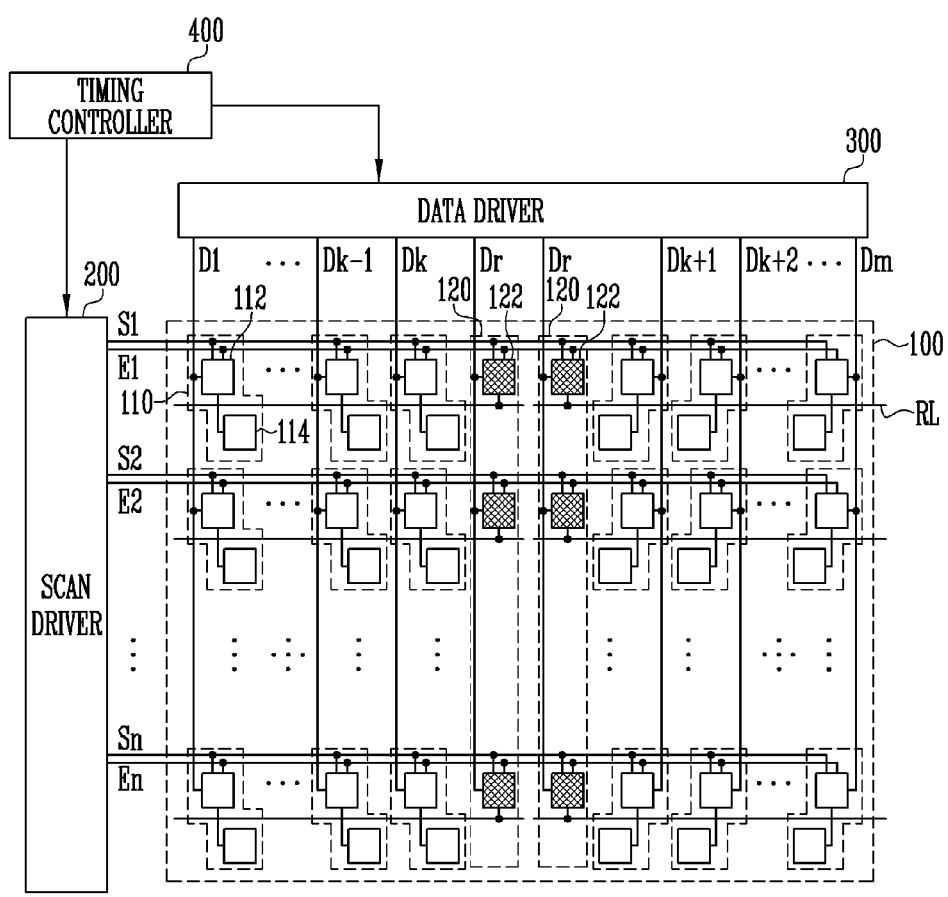
FIG. 6 is a diagram illustrating an organic light emitting display device according to an exemplary embodiment of the present invention.
Figure 7:
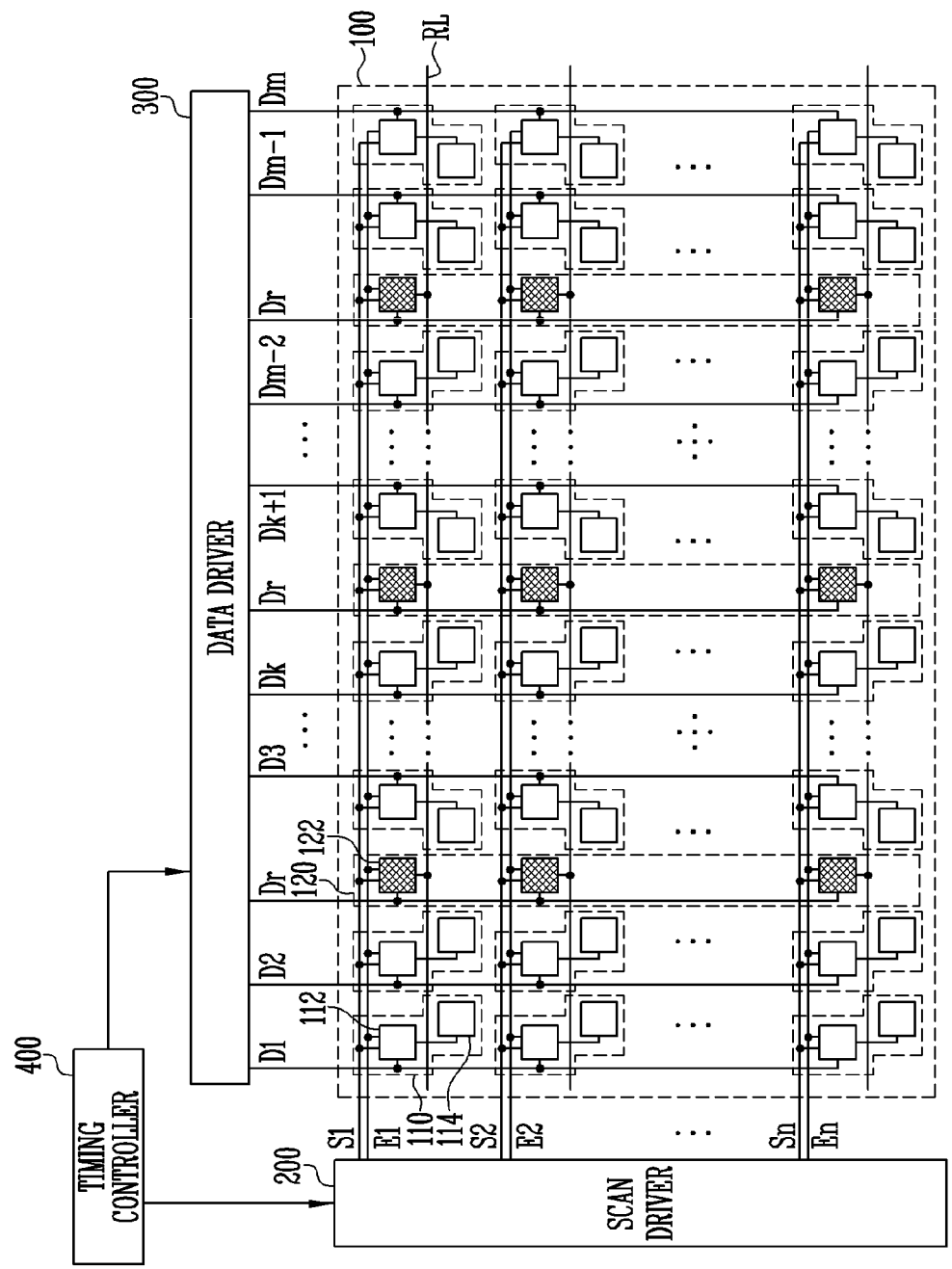
FIG. 7 is a diagram illustrating an organic light emitting display device according to yet an exemplary embodiment of the present invention.

FIGS. 6 and 7 are diagrams illustrating an organic light emitting display device according to exemplary embodiments of the present invention.

FIGS. 6 and 7 illustrate an exemplary embodiment in which a plurality of repair circuits 120 is included. In describing FIGS. 6 and 7, the similar or same constituent element as that of the exemplary embodiment illustrated in FIG. 1 is denoted by the same reference numeral, and a detailed description thereof will be omitted.

First, referring to FIG. 6, two or more repair circuit units 120 may be disposed to form at least two vertical lines (e.g., at least two horizontal lines when the repair circuit units 120 are disposed in a horizontal direction) at a central part of the display area.

Further, the plurality of repair circuits 120 may be disposed at the central part of the display area 100 to be adjacent to each other.

When the plurality of repair circuits 122 is included in each row line or each column line as described above, it may be possible to repair the plurality of pixels 110 disposed on the same row line or column line.

However, in order to prevent the organic light emitting diodes 114 of the plurality of repaired pixels 110 from being connected by the same repair line RL, the repair line RL may be implemented in a disconnected form between the repair circuits 122 disposed on the same row line or column line. Further, although not illustrated in FIG. 6, a plurality of repair lines RL may also be formed or disposed on each row line or column line to be connected with the repair circuits 122 disposed on each row line or column line, respectively.

Referring to FIG. 7, two or more repair circuit units 120 may be distributed at a predetermined interval and disposed within the display area 100.

More specifically, the number, the position, and/or the arrangement direction of repair circuit units 120, and the like may be variously changed within the display area 100.

By way of summation and review, a pixel circuit of the active matrix-type organic light emitting display device has a relatively complicated configuration, so that an elaborate fabricating process is demanded. Accordingly, a defect may be generated in the pixel circuit of the active matrix-type organic light emitting display device, so that yield may deteriorate.

According to exemplary embodiments of the present invention, organic light emitting display device may include the repair circuit unit for driving the organic light emitting diode instead of the pixel circuit when a defect is generated in the pixel circuit. Accordingly, it may be possible to more easily repair the defective pixel, thereby improving yield of the organic light emitting display device.

More particularly, according to exemplary embodiments of the present invention, it may be possible to prevent or impede an image quality from deteriorating by repairing a defect that may occur and improving an image quality by decreasing a distance between the repair circuit unit and the pixel by inserting the repair circuit unit into the display area in which the pixels may be disposed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
   a display area comprising:
      a plurality of pixels, each of the plurality of pixels comprising: an organic light emitting diode and a pixel circuit connected to the organic light emitting diode; and
      one or more repair circuit units disposed between the pixel circuits of the pixels disposed on adjacent lines; and
   data lines comprising:
      pixel data lines, each of the pixel data lines connected to respective pixel circuit; and
      one or more repair circuit data lines;
   wherein the one or more repair circuit units comprise a plurality of repair circuits arranged to form at least one line within the display area, and
   wherein each of the plurality of repair circuits is connected to one of the repair circuit data lines.

2. The organic light emitting display device of claim 1, wherein the one or more repair circuit units are disposed to form one vertical line or horizontal line at a central part of the display area.

3. The organic light emitting display device of claim 1, wherein two or more repair circuit units are disposed to form at least two vertical lines or horizontal lines at a central part of the display area.

4. The organic light emitting display device of claim 1, wherein two or more repair circuit units are distributed and disposed at a predetermined interval within the display area.

5. The organic light emitting display device of claim 1, wherein the pixel circuits of the pixels are disposed to be shifted at a predetermined interval with respect to the organic light emitting diode based on the one or more repair circuit units.

6. The organic light emitting display device of claim 5, wherein the pixel circuits of the pixels and the corresponding organic light emitting diodes are alternately disposed not to overlap each other, and
   the repair circuit unit is disposed on a vertical line or a horizontal line of the organic light emitting diodes included in a first set of pixels, the first set of pixels being adjacently disposed to the repair circuit unit.

7. The organic light emitting display device of claim 6, wherein the pixel circuits included in a second set of pixels are disposed on a vertical line or a horizontal line of the organic light emitting diode of a corresponding pixel among the second set of pixels and the organic light emitting diode of a pixel among the first set of pixels.

8. The organic light emitting display device of claim 5, wherein the organic light emitting diodes of the pixels are disposed at an upper side of the pixel circuit to partially overlap the pixel circuit of the corresponding pixel, and partially overlap the pixel circuit of the adjacent pixel or the repair circuit unit by a level by which the pixel circuits are shifted based on the repair circuit unit.

9. The organic light emitting display device of claim 8, wherein the organic light emitting diodes of the pixel partially overlap the pixel circuit of the adjacent pixel or the repair circuit unit by a level by which the pixel circuits are shifted based on the repair circuit unit.

10. The organic light emitting display device of claim 1, further comprising:
    a plurality of repair lines connected to the repair circuits.

11. The organic light emitting display device of claim 10, wherein the repair lines are arranged in a first direction crossing a second direction in which the repair circuits are arranged.

12. The organic light emitting display device of claim 10, wherein the repair lines partially overlap connection lines between the organic light emitting diodes and the pixel circuits of the pixels disposed on a row line or a column line in which the corresponding repair circuit is disposed.

13. The organic light emitting display device of claim 1, wherein the repair circuits are similarly configured as the pixel circuits.

14. The organic light emitting display device of claim 1, wherein at least one pixel among the pixels is disconnected between the organic light emitting diode and the pixel circuit, and the organic light emitting diode of the pixel is connected to the repair circuit unit to be driven.

15. The organic light emitting display device of claim 14, wherein the organic light emitting diode of the pixel is connected to a target repair circuit among the repair circuit units, the target repair circuit being disposed on the same row line or column line as that of the pixel.

16. An organic light emitting display device, comprising:
    a first pixel comprising:
       a first organic light emitting diode, and
       a first pixel circuit;
    a second pixel comprising:
       a second organic light emitting diode, and
       a second pixel circuit;
    a repair circuit disposed between the first pixel circuit and the second pixel circuit, and configured to drive the first organic light emitting diode when a defect is generated in the first pixel; and
    data lines comprising:
       pixel data lines, each of the pixel data lines connected to one of the pixel circuit and the second pixel circuit; and
       a repair circuit data line connected to the repair circuit.

17. An organic light emitting display device, comprising:
    a pixel comprising:
       an organic light emitting diode, and
       a pixel circuit configured to drive the organic light emitting diode;
    a repair circuit configured to drive the organic light emitting diode when a defect is generated in the pixel circuit; and
    data lines comprising:
       a pixel data line connected to the pixel circuit; and
       a repair circuit data line connected to the repair circuit.

* * * * *